(12) United States Patent
Banerjee et al.

(10) Patent No.: US 9,053,071 B2
(45) Date of Patent: Jun. 9, 2015

(54) SPIN TORQUE TRANSFER MAGNETIC TUNNEL JUNCTION INTELLIGENT SENSING

(75) Inventors: Abhishek Banerjee, San Diego, CA (US); Raghu Sagar Madala, San Diego, CA (US); Wenqing Wu, San Diego, CA (US); Kendrick H. Yuen, San Diego, CA (US); Chengzhi Pan, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 577 days.

(21) Appl. No.: 13/420,890

(22) Filed: Mar. 15, 2012

(65) Prior Publication Data

US 2013/0245999 A1    Sep. 19, 2013

(51) Int. Cl.
| | | |
|---|---|---|
| *G06F 17/18* | (2006.01) | |
| *G11C 27/02* | (2006.01) | |
| *H03M 1/04* | (2006.01) | |
| *H03M 1/50* | (2006.01) | |
| *H03M 3/02* | (2006.01) | |
| *G11C 11/16* | (2006.01) | |

(52) U.S. Cl.
CPC ............. *G06F 17/18* (2013.01); *G11C 11/16* (2013.01); *G11C 27/02* (2013.01); *H03M 1/04* (2013.01); *H03M 1/50* (2013.01); *H03M 3/02* (2013.01)

(58) Field of Classification Search
CPC .......................................................... G06F 17/18
USPC .......................................................... 702/181
See application file for complete search history.

(56) References Cited

U.S. PATENT DOCUMENTS

| | | | |
|---|---|---|---|
| 2011/0273926 A1 | 11/2011 | Wu et al. | |
| 2012/0036099 A1 | 2/2012 | Venkatraman et al. | |
| 2013/0073598 A1* | 3/2013 | Jacobson et al. | 708/252 |
| 2013/0107611 A1* | 5/2013 | Cai et al. | 365/158 |

FOREIGN PATENT DOCUMENTS

| | | |
|---|---|---|
| WO | 2011086378 A1 | 7/2011 |
| WO | 2011140471 A1 | 11/2011 |

OTHER PUBLICATIONS

International Search Report and Written Opinion—PCT/US2013/030896—ISA/EPO—May 6, 2013.

* cited by examiner

*Primary Examiner* — Bryan Bui
(74) *Attorney, Agent, or Firm* — Sam Talpalatsky; Nicholas J. Pauley; Joseph Agusta

(57) ABSTRACT

Sensor circuitry including probabilistic switching devices, such as spin-transfer torque magnetic tunnel junctions (STT-MTJs), is configured to perform ultra-low power analog to digital conversion and compressive sensing. The analog to digital conversion and compressive sensing processes are performed simultaneously and in a manner that is native to the devices due to their probabilistic switching characteristics.

12 Claims, 8 Drawing Sheets

SPIN TORQUE TRANSFER MAGNETIC TUNNEL JUNCTION INTELLIGENT SENSING

TECHNICAL FIELD

The present disclosure relates generally to data sensing and compression. More specifically, the present disclosure relates to analog to digital conversion and also to compressive sensing techniques.

BACKGROUND

Conventional analog-to-digital (ADC) circuitry such as Flash ADC circuitry, Sigma-delta ADC circuitry, and Successive Approximation Register (SAR) circuitry includes complicated sensing mechanisms, such as ladder comparators and additional digital-to-analog converter (DAC) circuitry. This complicated circuitry increase device cost in terms of area and power. In addition, because conventional ADC circuitry does not perform sampling rate compression natively, techniques such as random sampling or random convolution are used for sampling rate and data compression. This again adds to power and area cost.

SUMMARY

Aspects of the present disclosure include low power ADC circuitry using native compression techniques. The probabilistic switching nature of devices, such as spin-transfer torque magnetic tunnel junction (STT-MTJ) devices, may be exploited to perform analog to digital conversion (ADC) and compressive sensing. These processes may be performed simultaneously and in a manner that is native to the probabilistic switching characteristic of the devices without additional processing logic or conversion devices. The compressed signals may be easily and reliably reconstructed by receiver circuitry.

Aspects of the present disclosure provide ultra-low power compressive-sensing, which may be particularly advantageous for applications such as ambulatory electro-cardiogram (ECG) monitoring. In such applications, the ADC techniques provide reduced power consumption and native data compression techniques, and also provide reduced transmission rates, reduced radio power consumption, reduced radio congestion, reduced packet loss and/or reduced storage overheads.

A method of signal sensing according to an aspect of the disclosure includes presetting a bias value of a probabilistic sensor device, continuously sampling a signal relative to a bias until the probabilistic sensor device reaches a target state and recording an amount of time for the target state to be reached. According to an aspect of the present disclosure, the method also includes resetting the bias value to equal a current signal level and resetting the probabilistic sensor device.

A sensor device according to an aspect of the present disclosure includes means for continuously sampling a signal relative to a bias value until the sensor device reaches a target state relative to a bias level. The device also includes and means for recording an amount of time for the target state to be reached. According to an aspect of the present disclosure, the sensor device also includes means for resetting the bias value to equal a current signal level when the target state is reached and means for resetting the sensor device when the target state is reached.

A sensor apparatus according to an aspect of the present disclosure includes a cluster of spin torque transfer magnetic tunnel junctions (STT-MTJs) configured for continuously sampling a signal relative to a bias value until a sensor device reaches a target state relative to a bias level and counter circuitry coupled to the cluster of STT-MTJs. The counter circuitry is configured for recording an amount of time for the target state to be reached. According to an aspect of the disclosure, the sensor apparatus also includes precharge switching circuitry coupled to the cluster of STT-MTJs. The precharge switching circuitry is configured for resetting the bias value to equal a current signal level when the target state is reached. According to an aspect of the disclosure, reset circuitry is coupled to the cluster of STT-MTJs. The reset circuitry is configured for resetting the sensor device when the target state is reached.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

According to aspects of the present disclosure devices that exhibit a probabilistic switching characteristic, such as STT-MTJs, are employed for efficient sampling and analog to digital conversion of signals. Due in part to random thermal effects, devices such as STT-MTJs, may or may not switch states in response to an applied switching signal according to a probability of switching that is directly related to the strength of the switching signal. In STT-MTJs the two states are defined by parallel and anti-parallel magnetic alignments within the device. Switching from a parallel state to an anti-parallel state (P-AP) may occur at a different signal strength than switching from the anti-parallel state to the parallel state (AP-P). In other words, switching from the parallel state to the anti-parallel state (P-AP) may occur with a different probability than switching from the anti-parallel state to the parallel state (AP-P) for a given signal strength and pulse duration. The strength of the applied switching signal directly affects the probability that the device will switch states.

Figure 1:
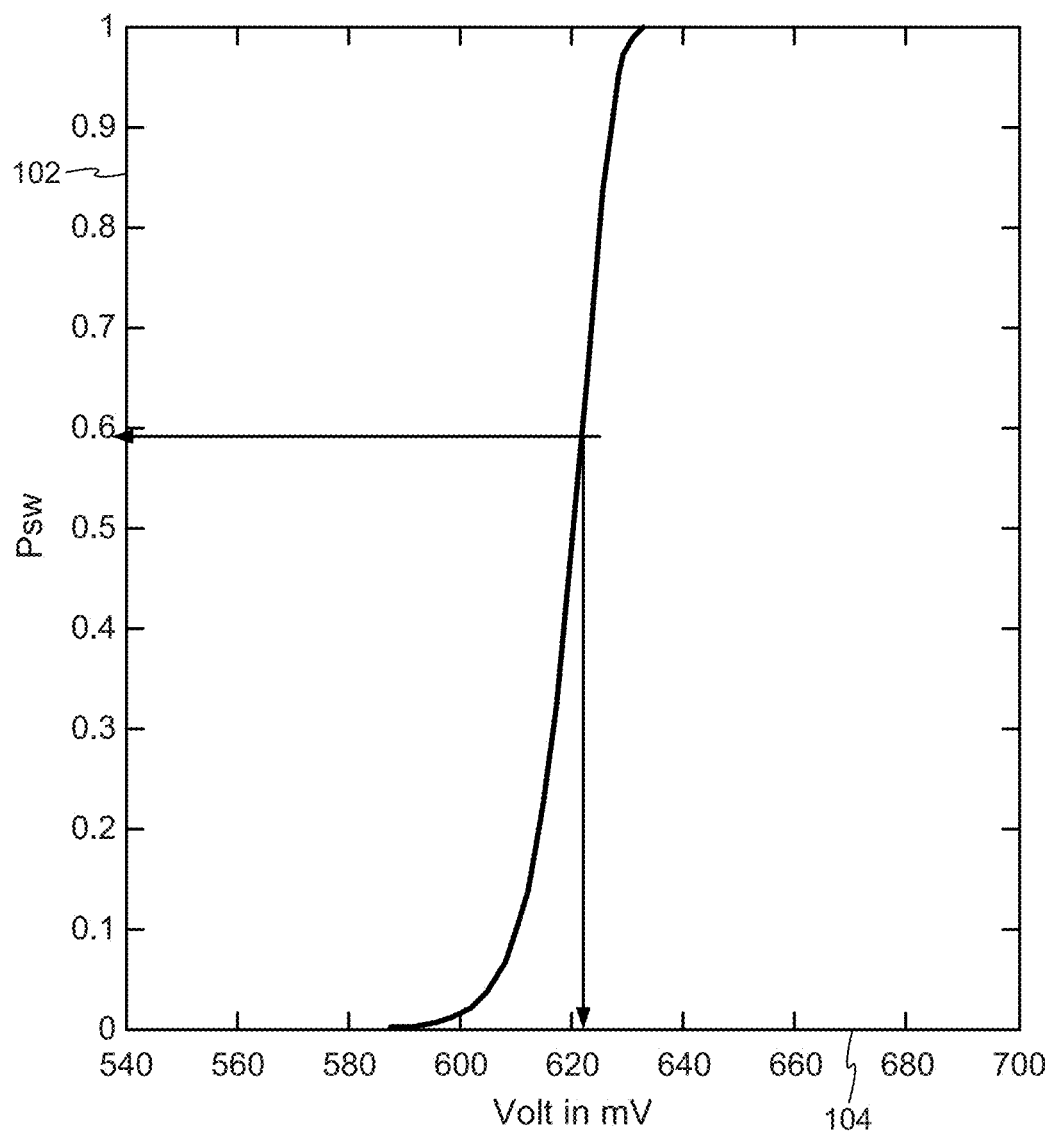
FIG. 1 is a graph conceptually illustrating a general example of a relationship between probability of switching an STT-MTJ and the strength of a switching signal applied to the STT-MTJ according to aspects of the present disclosure.

FIG. 1 illustrates an example of the relationship between the probability 102 of switching an STT-MTJ and the strength 104 of a switching signal applied to the STT-MTJ. The relationship shows that when a switching signal is applied at a given voltage and given pulse duration, the probability that the STT-MTJ will switch states is fixed. In this example, if the switching signal of 620 mV is applied for a predetermined pulse duration, the probability that the STT-MTJ will switch states (Psw) is 0.6. In other words, if a 620 mV pulse is applied for N=100,000 iterations to a single STT-MTJ having the illustrated switching probability characteristic, the STT-MTJ will switch states approximately 60,000 times. Similarly, if a pulse of 620 mV is applied for a single iteration to N=100,000 different STT-MTJs with the illustrated probabilistic characteristic, approximately 60,000 of the STT-MTJs will switch states. In this example the mean of the number of switching occurrences equals the number (N) of iterations or devices to which an iteration is applied times the switching probability ($SW_{mean}=N*Psw$). The distribution of the number of switching occurrences is binomial around the mean with a large variance ($\sigma=N*Psw*(1-Psw)$).

According to aspects of the disclosure, the switching probability characteristic of an STT-MTJ may be exploited to sense the strength of the applied switching signal by counting a number of times an STT-MTJ switches or by counting a number of switched STT-MTJs within a population of STT-MTJs to which the switching signal is applied.

Figure 2:
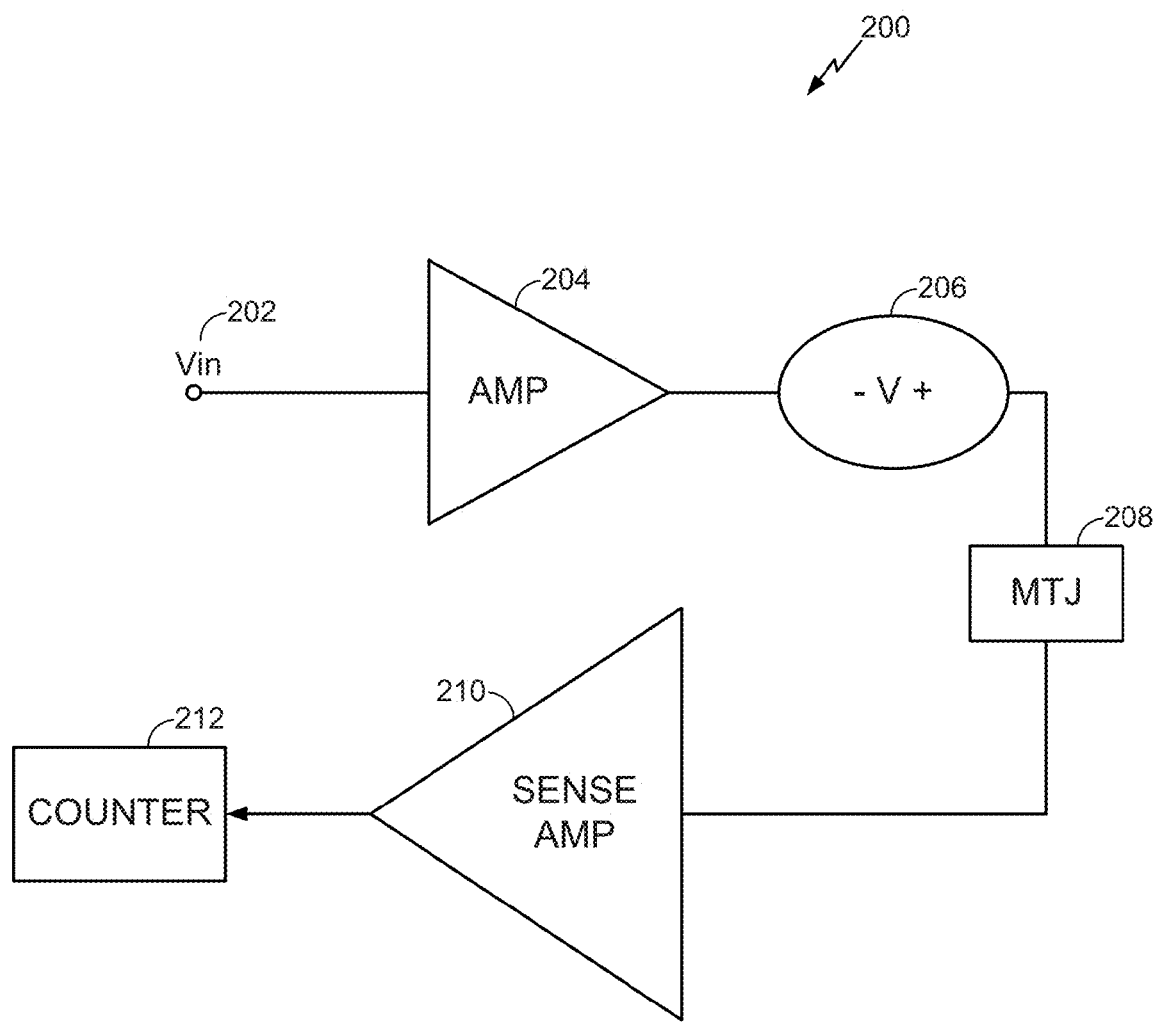
FIG. 2 is a high level schematic diagram conceptually illustrating an apparatus for probabilistic sensing according to aspects of the present disclosure.

An apparatus for probabilistic sensing according to an aspect of the disclosure is described with reference to FIG. 2. Sensing circuitry 200 includes input amplifier circuitry 204 coupled to an input node 202. Bias voltage supply circuitry 206 is coupled to the input amplifier circuitry 204. STT-MTJ circuitry 208 including at least one STT-MTJ is coupled to the bias voltage supply circuitry 206. Sense amplifier circuitry 210 is coupled to the STT-MTJ circuitry 208. Counter circuitry 212 is coupled to the sense amplifier circuitry 210.

Figure 3:
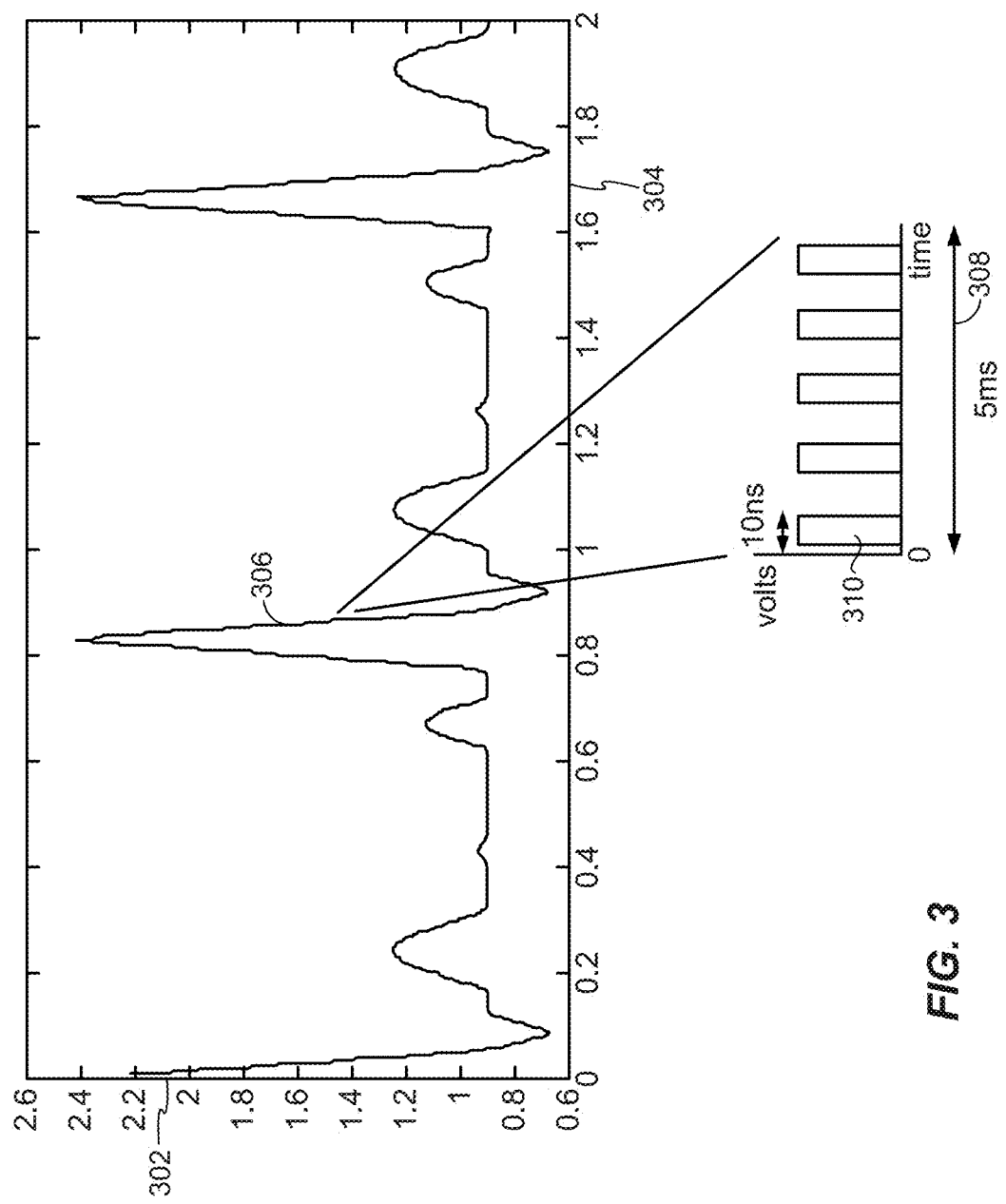
FIG. 3 is a graph conceptually illustrating sampling of an example input signal according to aspects of the present disclosure.

In order to suitably span the working range of an STT-MTJ, a signal on the input node 202 of the sensing circuitry 200 is amplified by the amplifier circuitry 204 and biased by the bias voltage supply circuitry 206. FIG. 3 shows a voltage 302 versus time 304 graph 300 of the amplified and biased signal 306. The amplified and biased signal 306 is iteratively applied to the STT-MTJ circuitry 208 at an appropriate sampling frequency. In the example shown in FIG. 3, the sampling frequency is 200 Hz which corresponds to a sampling interval 308 of 5 ms. During each sampling interval, the amplified and biased signal is applied to a single STT-MTJ for N=100,000 iterations 310 with a constant write time of 10 ns.

The sense amplifier circuitry 210 determines whether the STT-MTJ changed state for each iteration and the counter circuitry 212 counts how many state changes occurred for each sampling interval. According to aspects of the present disclosure, the number of state changes in each sampling interval is a digital value representing the analog input voltage for the interval.

In another aspect of the disclosure, the variance of the sensing circuitry 200 may be reduced by using a collection of STT-MTJs configured in parallel in the STT-MTJ circuitry 208. This configuration of STT-MTJ circuitry 208 is referred to as a parallel multi-level cell (MLC). In a multi-level cell, errors introduced by some STT-MTJs are offset by opposite errors introduced by other STT-MTJs. Multi-level cell configurations according to aspects of the present disclosure provide improved tunability of frequency, resolution and power of the sensing circuitry 200.

According to aspects of the present disclosure a multi-level cell configured with a number (N) of STT-MTJs in parallel can assume N+1 possible different states corresponding to different electrical resistance of the parallel STT-MTJs. The N+1 different states correspond to the number of switched STT-MTJs in the multi-level cell. Because switching of a single STT-MTJ is a Bernoulli Random variable ~Ber(p), a combination of such STT-MTJs in a multi-level cell behaves like a Binomial random variable. The probability distribution of the multi-level cell is Binomial(N,p), where N is the number of STT-MTJs and p is the probability of switching for a single STT-MTJ. According to one aspect of the disclosure, a cluster of STT-MTJs may be configured in a multi-level cell to establish the pre-determined probability relationship. The cluster may include a number of substantially similar STT-MTJs or a number of substantially dissimilar STT-MTJs, for example.

According to another aspect of the present disclosure, the amplified and biased signal is applied to a multi-level cell for a sample time that is not fixed. Rather than counting the number of times an STT-MTJ changes state as described previously with reference to FIG. 3, the counter circuitry 212 counts the time for a multi-level cell to reach a particular state in which a certain number of STT-MTJs have reached a switched state in response to the amplified and biased signal. The time to reach a particular state is a digital signal representing the analog input voltage. When the target threshold is reached, the STT-MTJs within the multi-level cell are reset and the sensing process repeats.

Figure 4C:
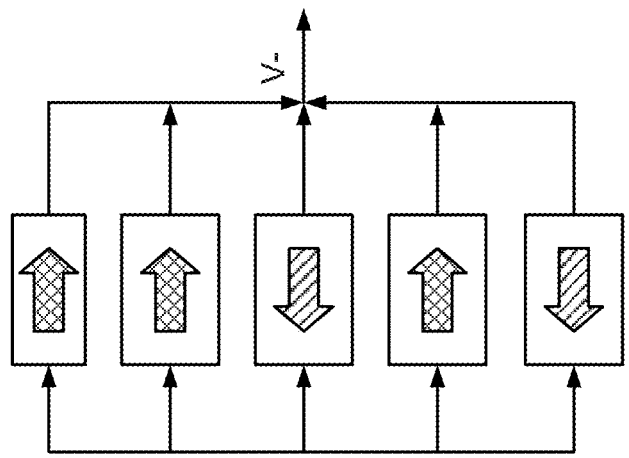
FIGS. 4A-4C show a high level block diagrams conceptually illustrating the operation of STT-MTJs configured in a parallel multi-level cell (MLC) according to aspects of the present disclosure.
Figure 4B:
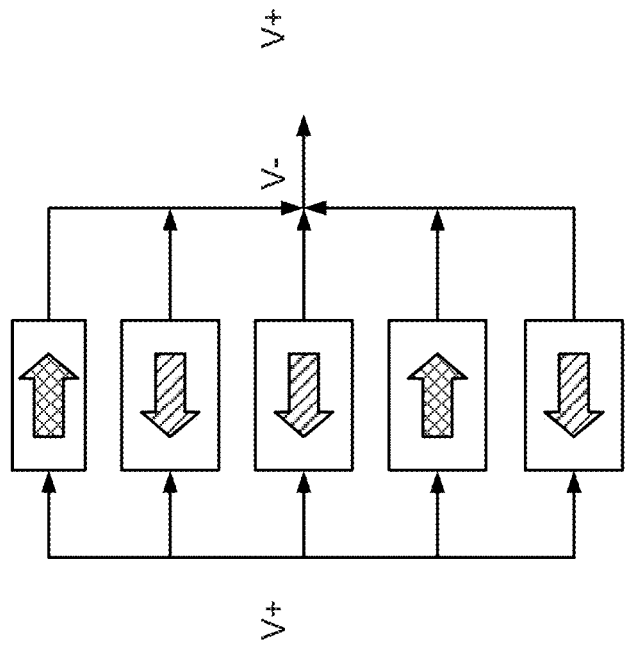
Figure 4A:
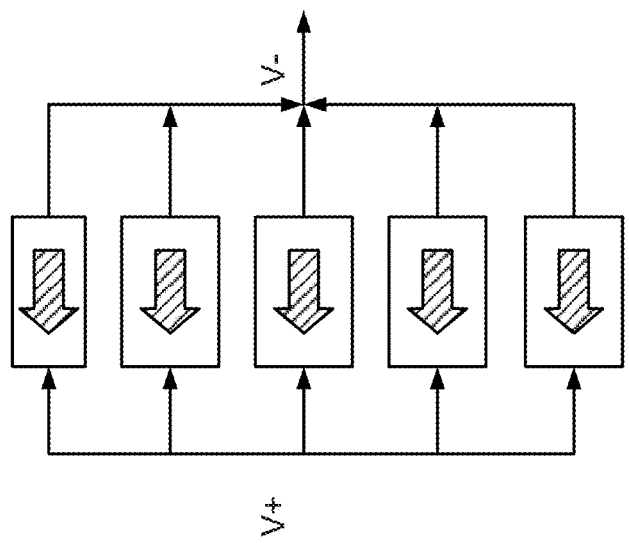

An example of a multi-level cell according to an aspect of the present disclosure is described with reference to FIGS. 4A-4C. In FIG. 4A, a set of STT-MTJs arranged in parallel are in a preset state at time t=0 in which none of the STT-MTJs have been switched. In this example, the number of STT-MTJs N=5 and a target threshold of 3 switched STT-MTJs is predetermined. An input voltage is applied to the multi-level cell at time t=0 ns. FIG. 4B shows the multi-level cell at time t=6 ns. FIG. 4C shows the multi-level cell when the target threshold is reached at time t=9 ns. The time t=9 ns represents the magnitude of the analog input voltage.

Aspects of the present disclosure include a method for reducing the time and power for resetting individual STT-MTJs in a multi-level cell after an iteration of a sensing process. In one configuration, the sensing circuitry for the STT-MTJs may be configured with reset circuitry coupled to the STT-MTJs for bidirectional switching so that the input signal may be used for both setting and resetting an STT-MTJ. This configuration increases resolution of the sensing circuitry without using additional power. In another configuration of reset circuitry, the STT-MTJs in one multi-level cell may be reset while the STT-MTJs in another multi-level cell are being written to in the sensing/ADC process described above. These resetting methods may be combined in a third configuration of reset circuitry in which bidirectional STT-MTJs are configured in a pair of cooperating multi-level cells. One multi-level cell may be reset while the STT-MTJs in another multi-level cell are being written, for example.

According to an aspect of the present disclosure, sensing circuitry including a multi-level cell can be configured to perform data compression automatically during a sensing and ADC process. In this configuration, sensing circuitry is configured to quantize the slope of an input signal rather than the magnitude of the input signal as described above. Because slope is a measure of the change of information, sampling frequency may be reduced when the slope is relatively low in order to compress the quantized information. Circuitry for performing adaptive slope quantization using a multi-level cell configured to measures larger sloped portions of a signal more frequently than smaller sloped portions of the signal according to aspects of the present disclosure is described with reference to FIG. 5.

Figure 5:
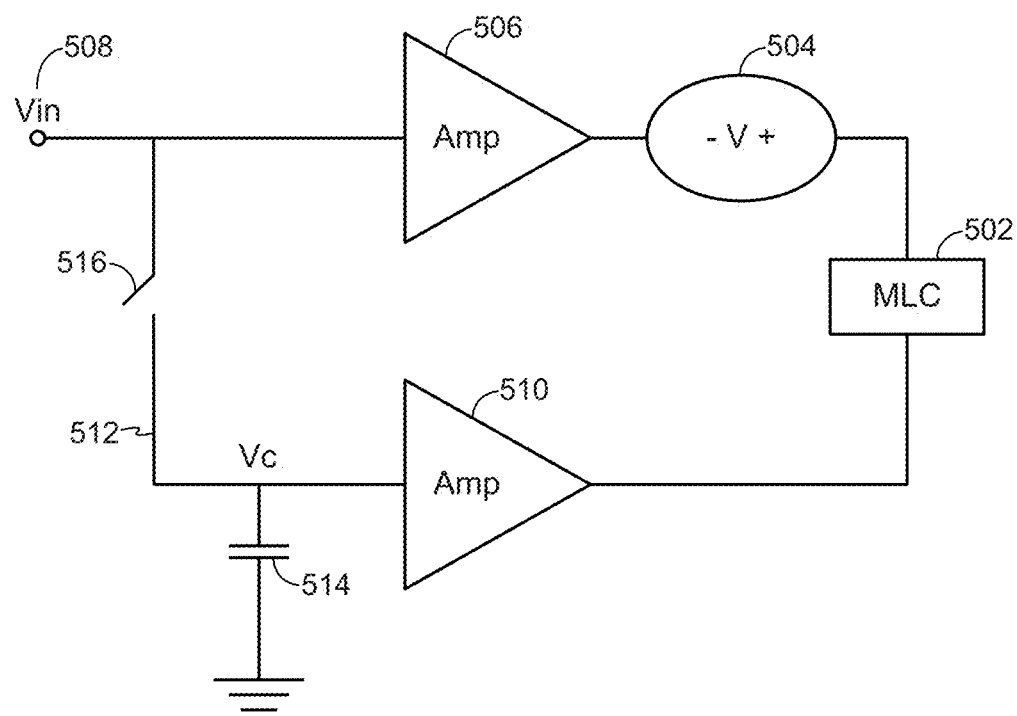
FIG. 5 is a high level schematic diagram conceptually illustrating an apparatus for adaptive slope quantization according to aspects of the present disclosure.

Referring to FIG. 5, adaptive slope quantization circuitry includes a multi-level cell 502 coupled to bias voltage supply circuitry 504. First input amplifier circuitry 506 is coupled between the bias voltage supply circuitry 504 and an input node 508. Second input amplifier circuitry 510 is coupled between the multi-level cell 502 and a precharge node 512. A precharge capacitor 514 is coupled between the precharge node 512 and ground. Precharge switching circuitry 516 is coupled between the input node 508 and the precharge node 512.

Adaptive slope quantization may be performed by closing the precharge switching circuitry 516 until the precharge capacitor 514 is charged to a present input voltage on the input node 508. The precharge switching circuitry 516 is then opened to enable the multi-level cell 502 to sense a differential signal, which represents a change in the input signal voltage. Counter circuitry determines the time or number of cycles taken for the multi-level cell to reach a predetermined target state as described above with reference to FIGS. 4A-4C, for example. When the target threshold is reached, the STT-MTJs within the multi-level cell are reset and the sensing process is repeated.

Because the multi-level cell is referenced to a precharge node, which is charged to a previous voltage, the time or number of cycles taken for the multi-level cell to reach a predetermined target state represents the change in voltage from the previous period and provides a quantized representation of the signal slope during the measurement period. This aspect of the disclosure automatically compresses the signal by acquiring less data for low slope portions of a signal because the multi-level cell takes longer to reach the target threshold when the input signal has a lower slope. Thus, the adaptive slope quantization circuitry adaptively adjusts the amount of information acquired in response to the signal slope.

Figure 6:
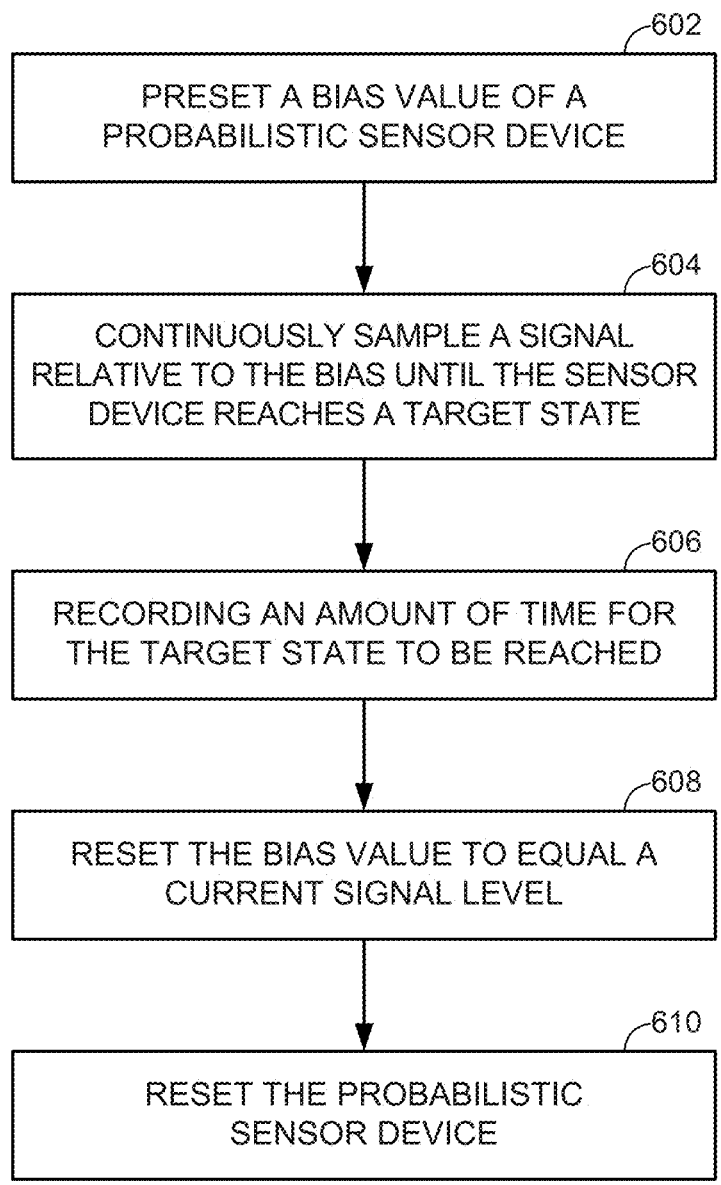
FIG. 6 is a process flow diagram illustrating a method for analog to digital conversion according to an aspect of the present disclosure.

A method of signal sensing according to aspects of the present disclosure is described with reference to FIG. 6. In block 602, a bias value of a probabilistic sensor device is preset. In block 604, a signal is continuously sampled relative to the bias value until the sensor device reaches a target state. In block 606, an amount of time for the target state to be reached is recorded. In block 608, the bias value is reset to equal a current signal level. In block 610, the probabilistic sensor device is reset.

A sensor device according to aspects of the present disclosure may include means for continuously sampling a signal relative to a bias value until the sensor device reaches a target state relative to a bias level and means for recording an amount of time for the target state to be reached. The sensor device may further include means for resetting the bias value to equal the current signal level when the target state is reached; and means for resetting the sensor device when the target state is reached. The means for continuously sampling a signal may include circuitry such as STT-MTJ circuitry 208, which is described with reference to FIG. 2, for example. The means for recording an amount of time for the target state to be reached may include circuitry such as counter circuitry 212, which is described with reference to FIG. 2, for example. The means for resetting the bias value may include circuitry such as pre-charge switching circuitry 516, which is described with reference to FIG. 5, for example. The means for resetting the sensor device may include the previously described reset circuitry, for example. In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 7:
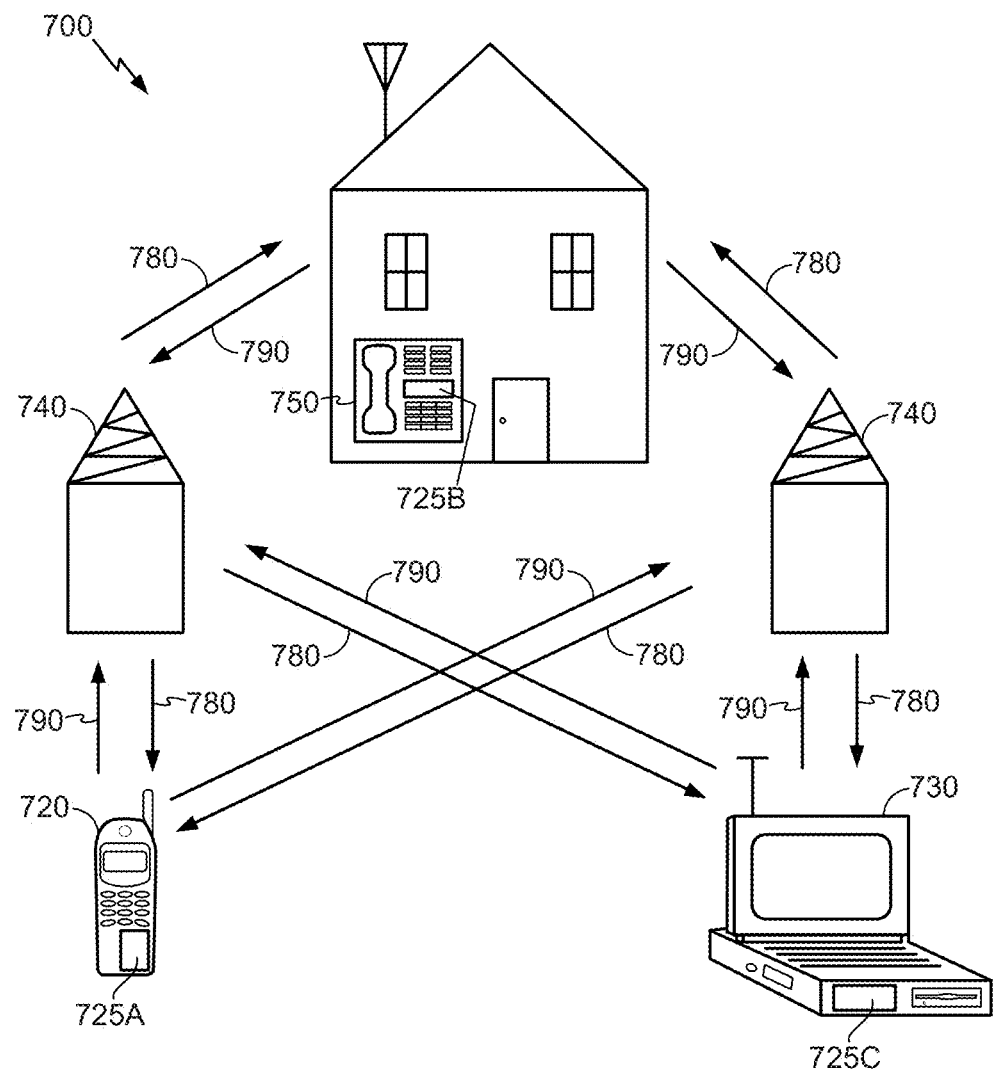
FIG. 7 is a block diagram showing an exemplary wireless communication system in which an aspect of the disclosure may be advantageously employed.

FIG. 7 shows an exemplary wireless communication system 700 in which a configuration of the disclosed signal sensing methods may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include the sensing circuitry 725A, 725B, and 725C, respectively. FIG. 7 shows forward link signals 780 from the base stations 740 and the remote units 720, 730, and 750 and reverse link signals 790 from the remote units 720, 730, and 750 to base stations 740.

In FIG. 7, the remote unit 720 is shown as a mobile telephone, remote unit 730 is shown as a portable computer, and remote unit 750 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 7 illustrates remote units, which may employ sensing circuitry according to the teachings of the disclosure, the disclosure is not limited to these exemplary illustrated units. For instance, sensing circuitry according to configurations of the present disclosure may be suitably employed in any device.

Although specific circuitry has been set forth, it will be appreciated by those skilled in the art that not all of the disclosed circuitry is required to practice the disclosed configurations. Moreover, certain well known circuits have not been described, to maintain focus on the disclosure.

Figure 8:
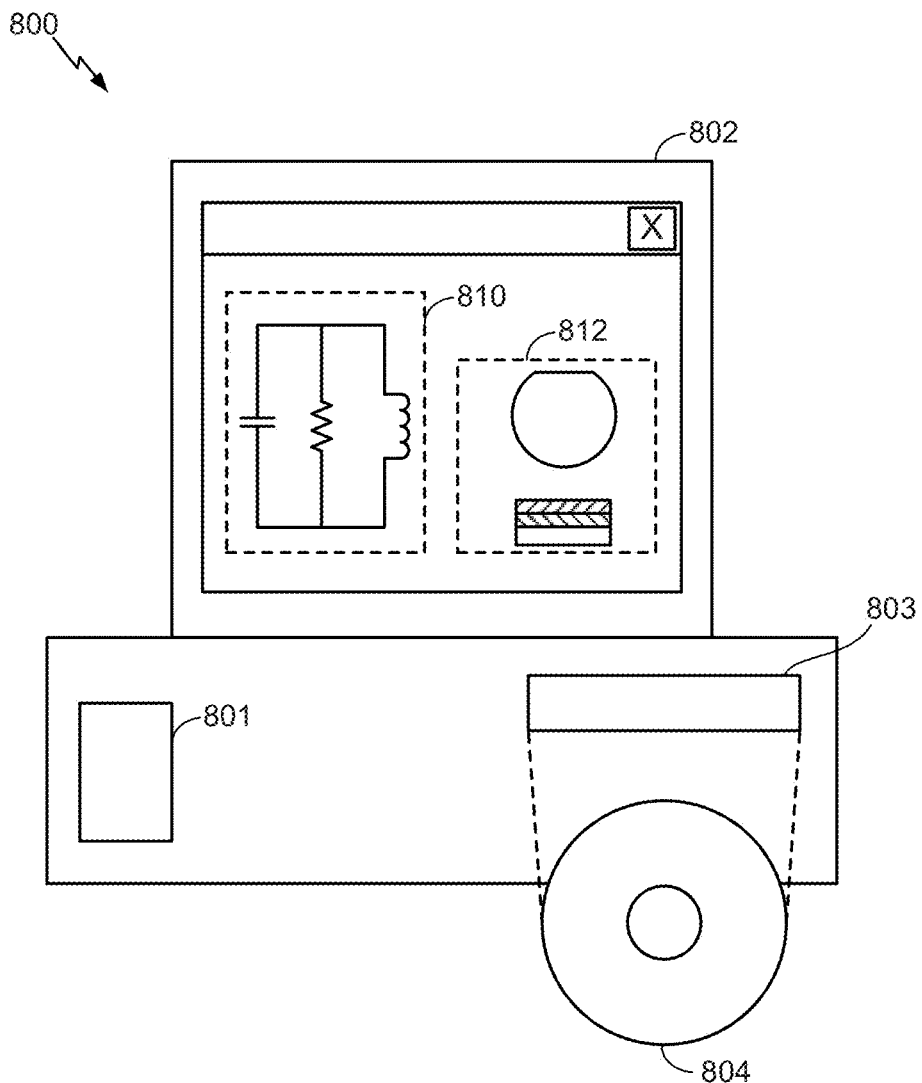
FIG. 8 is a block diagram illustrating a design workstation for circuit, layout, and logic design of a semiconductor component according to one aspect of the present disclosure.

FIG. 8 is a block diagram illustrating a design workstation used for circuit, layout, and logic design of a semiconductor component, such as the sensing circuitry disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as the sensing circuitry. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of analog signal sensing for analog to digital conversion comprising:
   presetting a bias value of a probabilistic sensor device comprising a plurality of spin torque transfer magnetic tunnel junctions interconnected in parallel;
   continuously sampling an analog input voltage signal relative to the bias value until the probabilistic sensor device reaches a target state;
   recording an amount of time for the target state to be reached, wherein the recorded amount of time being a digital signal representation of the magnitude of the analog input voltage signal;
   determining the magnitude of the analog input voltage signal based on a probability of switching the probabilistic sensor device in response to the sampling;
   resetting the bias value to equal a current level; and
   resetting the plurality of spin torque transfer magnetic tunnel junctions of the probabilistic sensor device.

2. The method of claim 1, wherein the magnitude of the analog input voltage signal is determined with reference to a predetermined voltage-probability relationship of the probabilistic sensor device.

3. The method of claim 1, further comprising:
   determining the probability of switching by counting a number of switched spin torque transfer magnetic tunnel junctions.

4. The method of claim 1 comprising:
   determining the probability of switching by counting a number of times that the probabilistic sensor device switches states during a predetermined period of time.

5. The method of claim 1, further comprising:
   integrating the sensor device into a mobile phone, a set top box, a music player, a video player, an entertainment unit, a navigation device, a computer, a hand-held personal communication systems unit, a portable data unit, and/or a fixed location data unit.

6. An analog to digital conversion sensor apparatus comprising:
   a cluster of spin torque transfer magnetic tunnel junctions interconnected in parallel, the cluster of spin torque transfer magnetic tunnel junctions exhibiting a probabilistic switching characteristic and configured to continuously sample an analog input voltage signal until the cluster of spin torque transfer magnetic tunnel junctions reaches a target state relative to a bias level;
   bias voltage supply circuitry coupled to the cluster of spin torque transfer magnetic tunnel junctions, the bias voltage supply circuitry configured to supply a bias voltage to the cluster of spin torque transfer magnetic tunnel junctions;
   counter circuitry coupled to the cluster of spin torque transfer magnetic tunnel junctions, the counter circuitry configured to record an amount of time for the target state to be reached, the recorded amount of time being a digital signal representation of the magnitude of the analog input voltage signal; and reset circuitry coupled to the cluster of spin torque transfer magnetic tunnel junctions, the reset circuitry configured to reset the cluster of spin torque transfer magnetic tunnel junctions when the target state is reached.

7. The sensor apparatus of claim 6, further comprising:
first input amplifier circuitry coupled between the bias voltage supply circuitry and an input node;
second input amplifier circuitry coupled between the cluster of spin torque transfer magnetic tunnel junctions and a precharge node;
a precharge capacitor coupled between the precharge node and a ground; and
precharge switching circuitry coupled between the input node and the precharge node and coupled to the cluster of spin torque transfer magnetic tunnel junctions.

8. The sensor apparatus of claim 7, in which the precharge switching circuitry is configured to quantize a slope of the analog input voltage signal.

9. The sensor apparatus of claim 7, in which the precharge switching circuitry is configured to quantize the analog input voltage signal magnitude.

10. The sensor apparatus of claim 6, integrated into a mobile phone, a set top box, a music player, a video player, an entertainment unit, a navigation device, a computer, a handheld personal communication systems unit, a portable data unit, and/or a fixed location data unit.

11. The sensor apparatus of claim 6, in which the cluster of spin torque transfer magnetic tunnel junctions comprises:
a cluster of substantially dissimilar spin torque transfer magnetic tunnel junctions configured to establish a predetermined probability relationship, the spin torque transfer magnetic tunnel junctions configured to continuously sample the analog input voltage signal relative to the bias level until the sensor device reaches a target state-relative to the bias level.

12. The sensor apparatus of claim 11, further comprising:
means for recording an amount of time for the target state to be reached, the recorded amount of time being a digital signal representation of the magnitude of the analog input voltage signal;
means for resetting the bias level to equal a current level of the analog input voltage signal when the target state is reached; and
means for resetting the cluster of substantially dissimilar spin torque transfer magnetic tunnel junctions when the target state is reached.

* * * * *